United States Patent [19]

Muto

[11] 3,909,628

[45] Sept. 30, 1975

[54] VOLTAGE-TO-CURRENT CONVERTER AND FUNCTION GENERATOR

[75] Inventor: Katsuya Muto, Kariya, Japan

[73] Assignee: Nippondenso Co., Ltd., Kariya, Japan

[22] Filed: July 12, 1973

[21] Appl. No.: 378,609

[30] Foreign Application Priority Data

July 18, 1972 Japan ................................ 47-72297

[52] U.S. Cl. ................ 307/229; 307/229; 307/297; 307/299

[51] Int. Cl.$^2$ ......................................... H03K 17/00

[58] Field of Search ....... 307/254, 229, 299 A, 297, 307/296; 328/142, 160

[56] References Cited

UNITED STATES PATENTS

| | | | |
|---|---|---|---|
| 3,518,458 | 6/1970 | Camenzind | 307/299 A |
| 3,541,350 | 11/1970 | Luetze | 328/142 |
| 3,624,425 | 10/1971 | Blumenstein | 307/296 |
| 3,689,752 | 9/1972 | Gilbert | 328/160 |

*Primary Examiner*—Michael J. Lynch
*Assistant Examiner*—B. P. Davis
*Attorney, Agent, or Firm*—Cushman, Darby & Cushman

[57] ABSTRACT

A voltage-to-current converter serving as a function generator or an essential element thereof and producing various output voltages in accordance with an input signal. It comprises a voltage-to-current converter circuit including at least two transistors, one of these transistors being an output transistor carrying current proportional to the potential difference between two input terminals respectively connected to the emitters of the two transistors, and a current-to-current converter providing at an output terminal a current proportional to the current through the aforementioned output transistor. With this voltage-to-current converter a function generator of a simple circuit construction may be produced inexpensively. Also, it may be readily made as a semiconductor integrated circuit.

3 Claims, 5 Drawing Figures

VOLTAGE-TO-CURRENT CONVERTER AND FUNCTION GENERATOR

BACKGROUND OF THE INVENTION

1. Field of the Invention

This invention relates to voltage-to-current converters serving as function generators or an essential element thereof and producing various output voltages according to an input signal.

2. Description of the Prior Art

The function generator of the afore-mentioned type has heretofore been constructed by using a plurality of operational amplifiers. However, the operational amplifier itself uses a very large number of component elements. Therefore, with a plurality of such operational amplifiers the circuit construction of the whole circuit is very complicated, so that difficulties are encountered in its manufacture as a semiconductor integrated circuit and it is very expensive.

SUMMARY OF THE INVENTION

In order to solve the above problems, the present invention has for its object the provision of a voltage-to-current converter, which comprises a voltage-to-current converter circuit and a second circuit (hereinafter referred to as current-to-current converter circuit) providing at an output terminal thereof a current proportional to the current through an output transistor in the voltage-to-current converter circuit, and with which a function generator of a similar circuit construction may be obtained inexpensively and readily produced as a semiconductor integrated circuit.

One feature of this invention resides in a voltage-to-current converter comprising a voltage-to-current converter circuit A including at least two transistors, one of these transistors being an output transistor adapted to carry current proportional to the potential difference between two input terminals respectively connected to the emitters of the two transistors, and a current-to-current converter circuit B providing at an output terminal a current proportional to the current through the output transistor of the voltage-to-current converter circuit A. This simple circuit construction can serve as a force-out type or withdraw type current source providing current in proportion to the voltage between the two input terminals and can readily permit arithmetic operations, which is very useful for constructing a function generator.

A second feature of the invention resides in a function generator comprising the afore-mentioned voltage-to-current converters, another voltage-to-current converter circuit C including at least two transistors, one of these transistors being an output transistor adapted to carry current proportional to the potential difference between two input terminals respectively connected to the emitters of the two transistors, and a current-to-voltage converter D producing a voltage proportional to the output current of the current-to-current converter circuit B of the voltage-to-current converter, one input terminal of the voltage-to-current converter circuit A of the voltage-to-current converter and one input of the other voltage-to-current converter circuit C being commonly connected to a signal input terminal, the outer input terminals of these voltage-to-current converter circuits A and C being used as respective reference potential input terminals. This circuit construction of the function generator is very simple compared to the prior art construction using operational amplifiers, and it can be readily manufactured as a semiconductor integrated circuit and is very inexpensive. Also, while the prior art construction using operational amplifiers requires two power sources, according to the invention only a single power source is necessary, so that the cost for the power source circuit may be reduced.

A third feature of the invention resides in a function generator comprising the afore-mentioned voltage-to-current converter and a further voltage-to-current converter circuit D providing a voltage proportional to the output current of the current-to-current converter circuit B of the voltage-to-current converter, wherein the output transistor of the voltage-to-current converter circuit A is a multi-emitter transistor, a signal input terminal being connected to the emitter of an input transistor of the voltage-to-current converter circuit A, the emitters of the multi-emitter transistor being connected to respective reference potential input terminals. With this construction, similar effects to those mentioned above in connection with the second feature of the invention may be obtained. Besides, unlike the circuit constituting the second feature of the invention only a single voltage-to-current converter circuit is required, so that the circuit construction of this function generator is further simplified and can be obtained further inexpensively.

DESCRIPTION OF THE PREFERRED EMBODIMENTS

Figure 1:
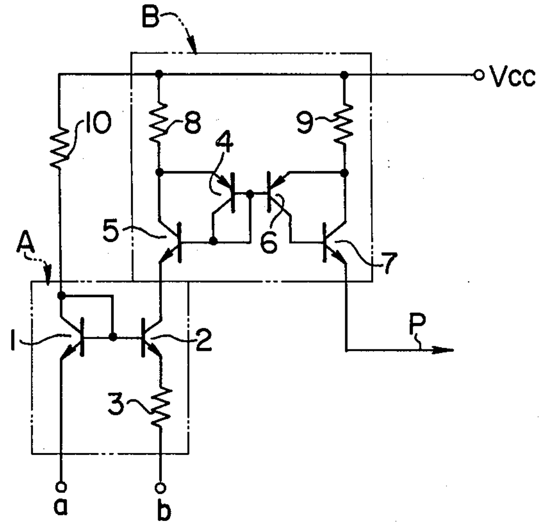
FIGS. 1 and 2 are circuit diagrams showing first and second embodiments of the voltage-to-current converter according to the first feature of the invention.

Referring to FIG. 1, labeled A is a voltage-to-current converter circuit producing current in proportion to the potential difference between input terminals *a* and *b*. It comprises two transistors 1 and 2 with the bases thereof connected to each other and a resistor connected between the emitter of the output side transistor 2 and the input terminal *b*. Labeled B is a current-to-current converter circuit providing to output terminal P a current proportional to the current flowing through the output side transistor 2 of the voltage-to-current converter circuit A irrespective of the load connected to the output terminal P. It comprises transistors 4 to 7 and resistors 8 and 9. The transistors 5 and 7 may be dispensed with if the transistors 4 and 6 have sufficiently high current amplification factor $h_{fe}$. In this case, the collector of the transistor 4 may be directly connected to the collector of the transistor 2, and the collector of the transistor 6 may be directly connected to the output terminal P. A resistor 10 serves to determine the collector current in the transistor 1, and its resistance is set such that the collector current through the transistor 1 is substantially the same as the collector current through the transistor 2.

Figure 3A:
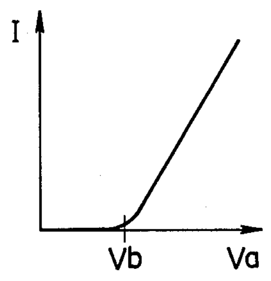
FIGS. 3*a* and 3*b* are graphs showing voltage-current characteristics of the voltage-to-current converter shown in FIG. 1.
Figure 3B:
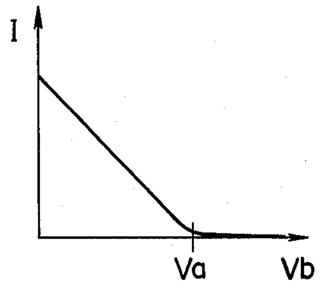

The operation of the above construction will now be described. Denoting the emitter potential on the transistor 1, i.e., the potential at the input terminal *a*, by $V_a$, potential at the input terminal *b* by $V_b$ and the resistance of the resistor 3 by $R_3$ the emitter potential on the transistor 2 is given as $$V_a + (V_{BE} \text{ across the transistor } 1) - (V_{BE} \text{ across the transistor } 2) \approx V_a$$

where $V_{BE}$ is the forward base-emitter voltage across the transistors 1 and 2 which are substantially equal to each other. Thus, the current through the resistor 3 is $(V_a - V_b)/R_3$. This current is the resultant of the base current and collector current through the transistor 2. Since the current amplification factor $h_{fe}$ of the transistor 2 is large and the base current is small compared to the collector current and ignorable, the current through the resistor 3 can be regarded as the collector current through the transistor 2. This means that the collector current I in the transistor 2 changes in proportion to the potential difference between the input terminals *a* and *b*, as shown in FIG. 3. The plot in FIG. 3*a* is obtained where the potential $V_a$ at the input terminal *a* is changed with the potential at the input terminal *b* held constant, while the plot in FIG. 3*b* is obtained in case where the potential $V_b$ at the input terminal *b* is changed with the potential $V_a$ at the input terminal *a* held constant. It will be noted that the current I changes exponentially in the neighborhood of $V_a = V_b$. This is because the $V_{BE}$ on the transistor 1 and 2 is not equal in this range, but this leads to no problem since this range is narrow compared to the working potential difference and may be ignored.

The collector current I through the transistor 2 is the resultant of the base current and collector current through the transistor 5, and since the $h_{fe}$ of the transistor 5 is large the collector current I is substantially equal to the current through the resistor 8. Since bases of the transistors 4 and 6 are commonly connected, denoting the base potential on the transistors 4 and 6 by $V_B$ the emitter potential on the transistor 4 is $V_B$ plus $V_{BE}$ across the transistor 4, and the emitter potential on the transistor 6 is $V_B$ plus $V_{BE}$ across the transistor 6. Thus, the current flowing through the resistor 9 is ($V_{cc}$ - $V_B$ - $V_{BE}$ across the transistor 6)/9, where $V_{BE}$ is the base-emitter potential across the transistor 6, and this current is forced out from the output terminal P. The $V_{BE}$ across the transistor 4 is made equal to that across the transistor 6 by appropriately selecting the resistors 8 and 9, so that the current forced out from the output terminal P is determined by the current I through the transistor 2 and the ratio between the resistances of the resistors 8 and 9. Thus, the circuit functions as a voltage-to-current converter constituting a force-out type current source.

Figure 2:
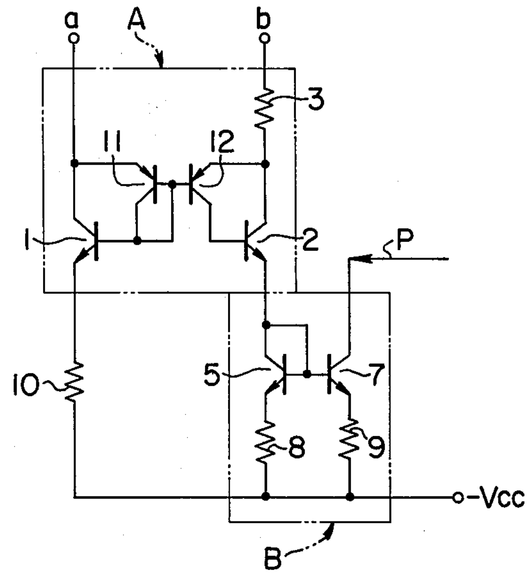

FIG. 2 shows another example of the voltage-to-current converter circuit according to the invention, which is constructed as a withdraw type current source. The operation of this circuit is basically similar to that of the circuit of FIG. 1. In this case, current flowing into transistor 7 is produced in proportion to the potential difference between input terminals *a* and *b* at output terminal P. In this circuit, both voltage-to-current converter circuit A and current-to-current converter circuit B use different numbers of transistors from those in the circuit of FIG. 1. This is because the current amplification factors $h_{fe}$ of the transistors are different, and of course a construction using the same number of transistors as in the circuit of FIG. 1 is possible if the $h_{fe}$ is the same.

Figure 4:
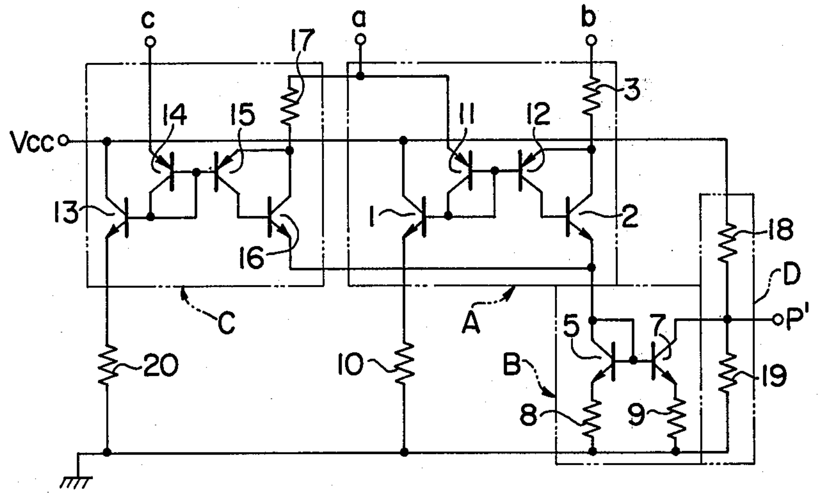
FIG. 4 is a circuit diagram showing an embodiment of the function generator according to the second feature of the invention.

FIG. 4 shows a function generator circuit using the afore-mentioned voltage-to-current converter circuit. Labeled A and B are voltage-to-current converter and current-to-current converter circuits constituting the voltage-to-current converter shown in FIG. 2. To input terminal *a* is supplied an input signal representing engine speed or the like, while input terminal *b* is held at a constant reference potential. Labeled C is a voltage-to-current converte circuit similar to the voltage-to-current converter circuit A. It comprises transistors 13 to 16 and a resistor 17. Its one input terminal is connected to the afore-mentioned signal input terminal *a*, while its other input terminal *c* is held at a constant reference potential different from that at the input terminal *b*. Labeled D is a current-to-voltage converter circuit comprising resistors 18 and 19 and providing a voltage proportional to the output current of the current-to-current converter circuit B at an output terminal P'. A resistor 20 serves the same end as that of resistor 10.

In the above construction, denoting the signal potential at the input terminal *a* by $V_{in}$, the reference potential at the input terminal *b* by $V_b$, the reference potential at the input terminal *c* by $V_c$ and the resistances of the resistors 8, 9, 17, 18 and 19 respectively by $R_8$, $R_9$, $R_{17}$, $R_{18}$ and $R_{19}$ and setting $V_b < V_c$ and $R_8 = R_9$, in the absence of current through the transistor 7 a voltage $V_{01}$ given as $(R_{19}/(R_{18} + R_{19}))$. $V_{cc}$ prevails at the output terminal P'. The voltage $V_{out}$ at the output terminal P' changes with the potential $V_{in}$ at the input terminal *a* in a way as shown in FIG. 5 and as will be described hereinafter.

Figure 5:
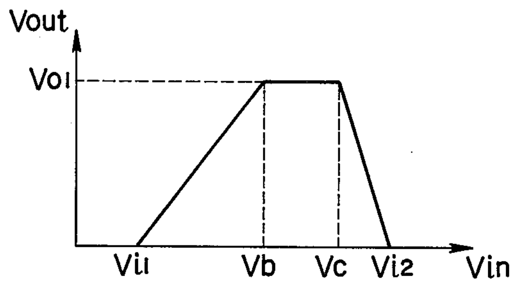
FIG. 5 is a graph showing an input-output characteristic of the embodiment of FIG. 4.

1. For a range of $0 < V_{in} < V_b$, current flows into the transistor 7 in proportion to the potential difference between the input terminals *a* and *b*, and by this current the current through the resistors 18 and 19 is reduced from the value when the transistor 7 is "off", and $V_{out}$ is reduced from $V_{01}$ by the corresponding amount. In this case, $V_{out}$ can be calculated from an equation $$V_{out} = V_{01} - (R_{18}//R_{19}) \cdot \frac{V_b - V_{in}}{R_3}$$

and it increases in proportion to $V_{in}$ up to $V_{01}$ as shown in FIG. 5.

2. For a range of $V_b \leqq V_{in} \leqq V_c$, either the base and emitter of the transistor 12 are at the same potential or the transistor 12 is reversely biased, so that the transistors 12 and 2 are off. Also, the base and emitter of the transistor 15 are at the same potential or the transistor 15 is reversely biased, so that the transistors 15 and 16 are off. Thus, the transistors 5 and 7 are also off, so that for this range $V_{out} = V_{01}$, that is, $V_{out}$ is constant even if $V_{in}$ changes, as shown in FIG. 5.

3. For a range of $V_c < V_{in}$, current flows into the transistors 16 and 7 in proportion to the potential difference between the input terminals *a* and *b*, and by this current $V_{out}$ is reduced from $V_{01}$. In this case, $V_{out}$ can be calculated from an equation $$V_{out} = V_{01} - (R_{18}//R_{19}) \cdot \frac{V_{in} - V_c}{R_{17}}$$

and it decreases with increase in $V_{in}$ as shown in FIG. 5.

In the above way, with the function generator of FIG. 4 the voltage $V_{out}$ appearing at the output terminal P' changes according to the potential $V_{in}$ at the input terminal *a* as shown in FIG. 5. This function generator may be applied, for instance, to fuel injection systems for internal combustion engines. In such case, an input signal representing the engine speed may be supplied to the input terminal *a*, and the voltage $V_{out}$ appearing at the output terminal P' may be coupled to an electromagnetic valve fuel injection control.

Figure 6:
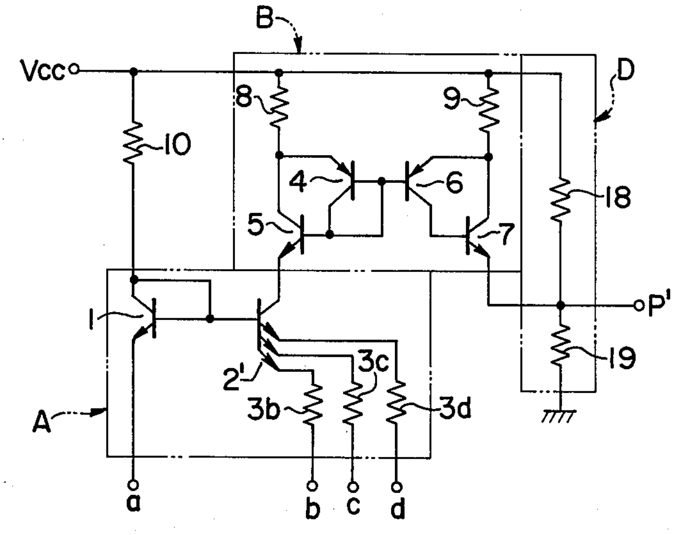
FIG. 6 is a circuit diagram showing an embodiment of the function generator according to the third feature of the invention.
Figure 7:
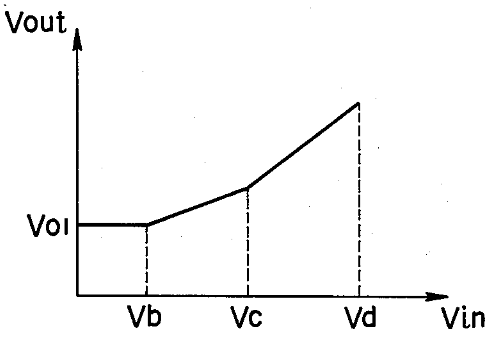
FIG. 7 is a graph showing an input-output characteristic of the embodiment of FIG. 6.

FIG. 6 shows another function generator. While the previous example of FIG. 4 has used the two voltage-to-current converter circuits A and C, this function generator is constructed with a single voltage-to-current converter circuit A. This voltage-to-current converter circuit A uses a multi-emitter transistor 2' as the output side transistor. The emitters of this transistor 2' are connected through resistors 3*b*, 3*c* and 3*d* to respective reference potential input terminals *b*, *c* and *d*. By appropriately selecting the potentials $V_b$, $V_c$ and $V_d$ at the input terminals *b*, *c* and *d* such that $V_b<V_c<V_d$, it is possible to have the voltage $V_{out}$ appearing at the output terminals P' with change in a way approximating a curve of the second order as shown in FIG. 7. In this case, when the potential $V_{in}$ at the input terminal *a* is in a range of $V_b < V_{in} < V_c$ current flows through the resistor 3*b* in proportion to the potential difference between the input terminals *a* and *b*. This current constitutes the collector current through the transistors 5 and 7 to increase the current through the resistor 19 for increasing the voltage $V_{out}$ at the output terminal P'. For a range of $V_c < V_{in} < V_d$, current flows through the resistor 3*c* in addition to the afore-mentioned current, so that the current through the resistor 19 is increased by the additional current, thus increasing the range of increase of the voltage $V_{out}$ at the output terminal P' with change in $V_{in}$. For a range of $V_d < V_{in}$, the current through the resistor 19 is further increased with a further additional current through the resistor 3*d*, thus further increasing the rate of increase of the voltage $V_{out}$ at the output terminal P' which change in $V_{in}$. In this way, a characteristic simulating a curve of the second order can be obtained. Of course, the desired characteristic may be approximated more closely by increasing the number of emitters of the multi-emitter transistor 2'.

I claim:

1. A voltage-to-current converter comprising:

a. first and second input terminals having first and second input signals applied thereto, b. a voltage-to-current conversion circuit including a first input transistor having its emitter connected to said first input terminal, a first output transistor having its base connected in common with the base of said first input transistor, and a resistor connected between the emitter of said first output transistor and said second input terminal, said voltage-to-current conversion circuit flowing through said first output transistor a current proportional to the voltage difference between the first and second input terminals, the base and collector of said first input transistor being connected with each other, the collector of said first input transistor being connected to a power supply, said first input and output transistors being of one conductivity type, c. a current-to-current conversion circuit including a second input transistor and a second output transistor, the collector of said first output transistor of said voltage-to-current conversion circuit being connected with the collector of said second input transistor, the base and collector of said second input transistor being connected with each other, the emitters of said second input and output transistors being connected to said power supply, the base of said second input transistor being connected in common with the base of said second output transistor, said second input and output transistors being of a conductivity type opposite to that of said first input and output transistors, said current-to-current conversion circuit supplying through said second output transistor to an output terminal connected to the collector of said second output transistor a current proportional to the current flowing through said first output transistor.

2. A function generator comprising:

a. a common signal input terminal having an input signal applied thereto, b. first and second reference potential input terminals having constant reference voltages of different potential applied thereto, respectively, c. a first voltage-to-current conversion circuit including a first input transistor having its emitter connected to said common signal input terminal, a first output transistor having its base connected in common with the base of said first input transistor, and a first resistor connected between the emitter of said first output transistor and said first reference potential input terminal, said first voltage-to-current conversion circuit flowing a current proportional to the voltage difference between said first reference potential input terminal and said common signal input terminal through said first output transistor, the base and collector of said first input transistor being connected with each other, the collector of said first input transistor being connected to a power supply, said first input and output transistors being of one conductivity type, d. a second voltage-to-current conversion circuit including a second input transistor having its emitter connected to said second reference potential input terminal, a second output transistor having its base connected in common with the base of said second input transistor, and a second resistor connected between the emitter of said second ouput transistor and said common signal input terminal, said second voltage-to-current conversion circuit flowing a second current porportional to the voltage difference between said second reference potential input terminal and said common signal input terminal through said second input transistor, the base and collector of said second input transistor being connected with each other, the collector of said second input transistor being connected to said power supply, said second input and output transistors being of said one conductivity type same as that of said first input and output transistors, e. a current-to-current conversion circuit including a third input transistor and a third output transistor, the collectors of said first and second output transistors of said first and second voltage-to-current conversion circuits being connected with the collector of said third input transistor, the base and collector of said third input transistor being connected with each other, the emitters of said third input and output transistors being connected to said power supply, the base of said third input transistor being connected in common with the base of said third output transistor, said third input and output transistors being of a conductivity type opposite to that of said first input and output transistors, said current-to-current conversion circuit supplying through said third output transistor to an output terminal a third current proportional to said first and second currents flowing through both of said first and second output transistors, and f. a current-to-voltage conversion circuit comprising third and fourth resistors connected to the collector of said third output transistor of said current-to-current conversion circuit for producing a voltage proportional to said third current of said current-to-current conversion circuit.

3. A function generator comprising:

a. an input terminal having an input signal applied thereto, b. a plurality of reference potential input terminals having a plurality of constant reference voltages of different potential applied thereto, respectively, c. a voltage-to-current conversion circuit including a first input transistor of one conductivity type having its emitter connected to said input terminal, an output multi-emitter transistor with a plurality of emitters and having its base connected in common with the base of said first input transistor, and a plurality of resistors each connected between respective ones of the emitters of said output multi-emitter transistor and respective ones of said reference potential input terminals, said voltage-to-current conversion circuit flowing currents each proportional to the voltage difference between respective ones of said reference potential input terminals and said input terminal through respective ones of the emitters of said output multi-emitter transistor, the base and collector of said first input transistor being connected with each other, the collector of said first input transistor being connected to a power supply, said output multi-emitter transistor being of said one conductivity type same as that of said first input transistor, d. a current-to-current conversion circuit including a second input transistor having its collector connected to the collector of said output multi-emitter transistor of said voltage-to-current conversion circuit, and a second output transistor having its base connected with the base of said second input transistor, said current-to-current conversion circuit supplying to an output terminal an output current proportional to said currents flowing through said output multi-emitter transistor, the base and collector of said second input transistor being connected with each other, both emitters of said second input and output transistors being connected to said power supply, said second input and output transistors being of a conductivity type opposite to that of said first input and output transistors, e. a current-to-voltage conversion circuit connected to the collector of said second output transistor of said current-to-current conversion circuit for producing a voltage at said output terminal proportional to said output current of said current-to-current conversion circuit.

* * * * *